United States Patent [19]

Chuang et al.

[11] Patent Number: 4,611,309
[45] Date of Patent: Sep. 9, 1986

[54] NON-VOLATILE DYNAMIC RAM CELL

[75] Inventors: Patrick T. Chuang, Cupertino; Ron Maltiel, Mountain View; Robert L. Yau, Sunnyvale, all of Calif.

[73] Assignee: Advanced Micro Devices, Inc., Sunnyvale, Calif.

[21] Appl. No.: 654,332

[22] Filed: Sep. 24, 1984

[51] Int. Cl.[4] .............................................. G11C 11/34
[52] U.S. Cl. .................................... 365/185; 365/182; 357/23.5
[58] Field of Search ............... 365/182, 184, 185, 190, 365/104; 357/23.5

[56] References Cited

U.S. PATENT DOCUMENTS 4,337,522 6/1982 Stewart ................................. 365/190
4,354,255 10/1982 Stewart ........................... 365/185 X

*Primary Examiner*—Joseph A. Popek
*Attorney, Agent, or Firm*—Patrick T. King; Eugene H. Valet

[57] ABSTRACT

A non-volatile dynamic RAM circuit where each memory cell includes an access transistor, a floating gate structure, and a recall transistor connected in series between an I/O bit line and a common line. A conducting plate and storage node of the floating gate structure functions as the volatile storage element of the cell and the floating gate functions as the non-volatile storage element.

40 Claims, 11 Drawing Figures

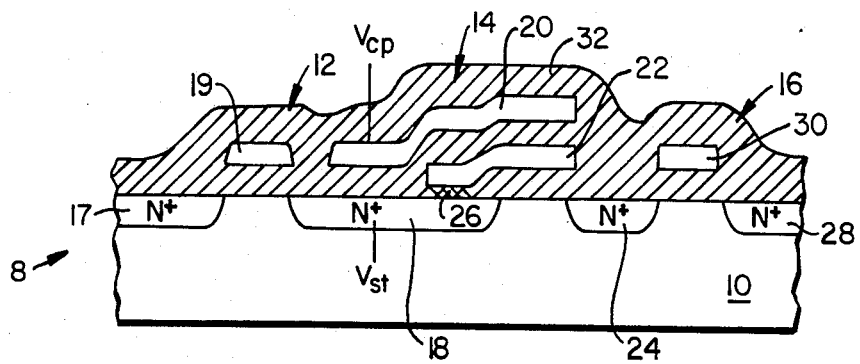
FIG._1.
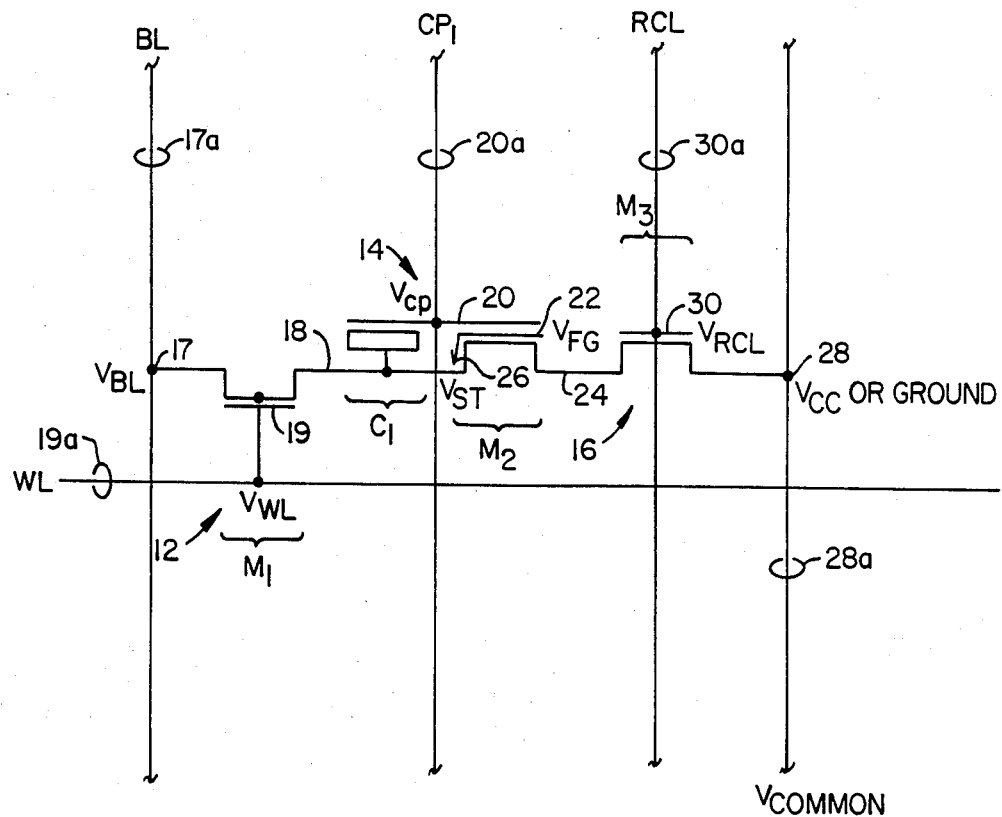
FIG._2.

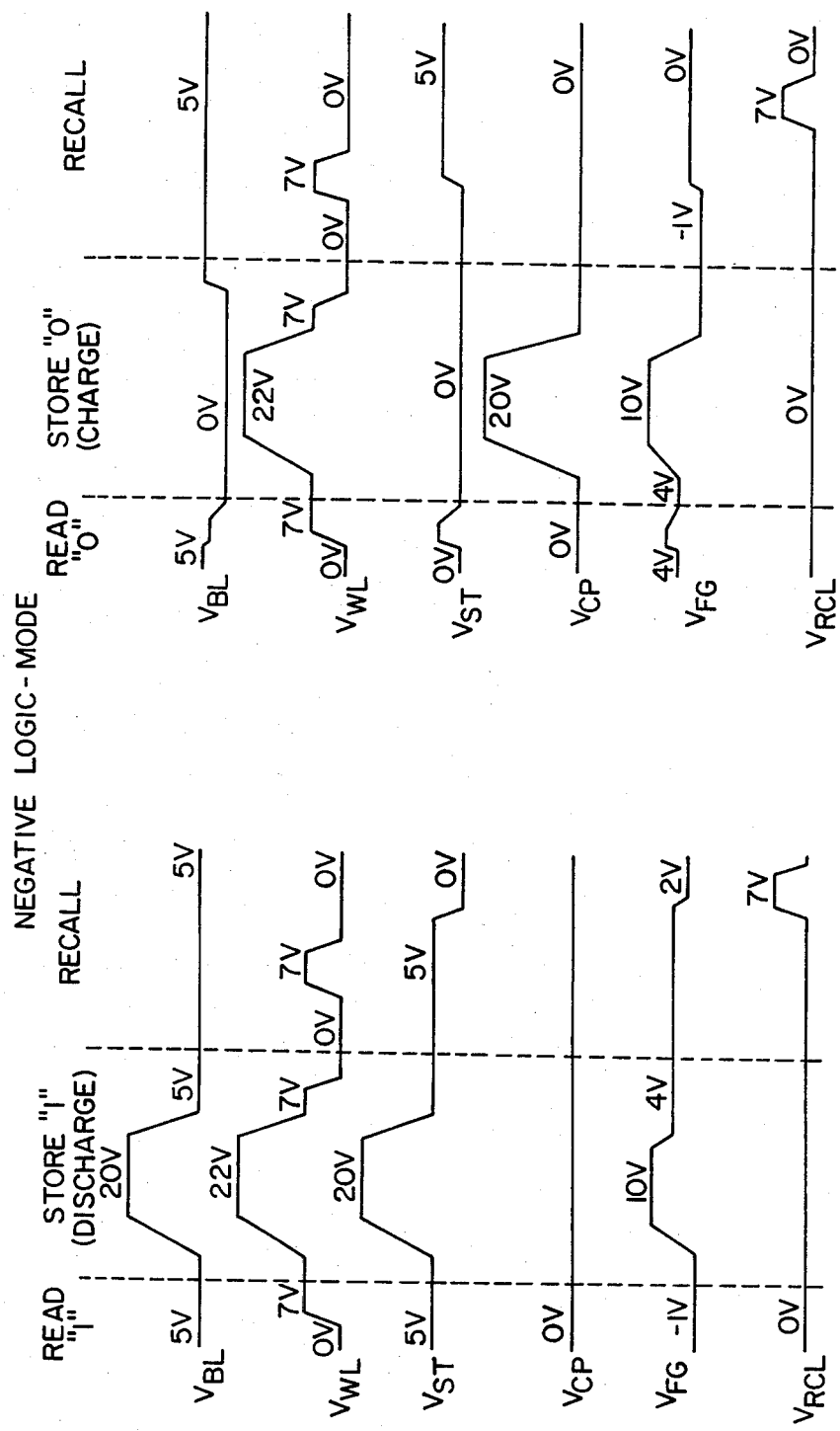
FIG._3B.
FIG._3A.

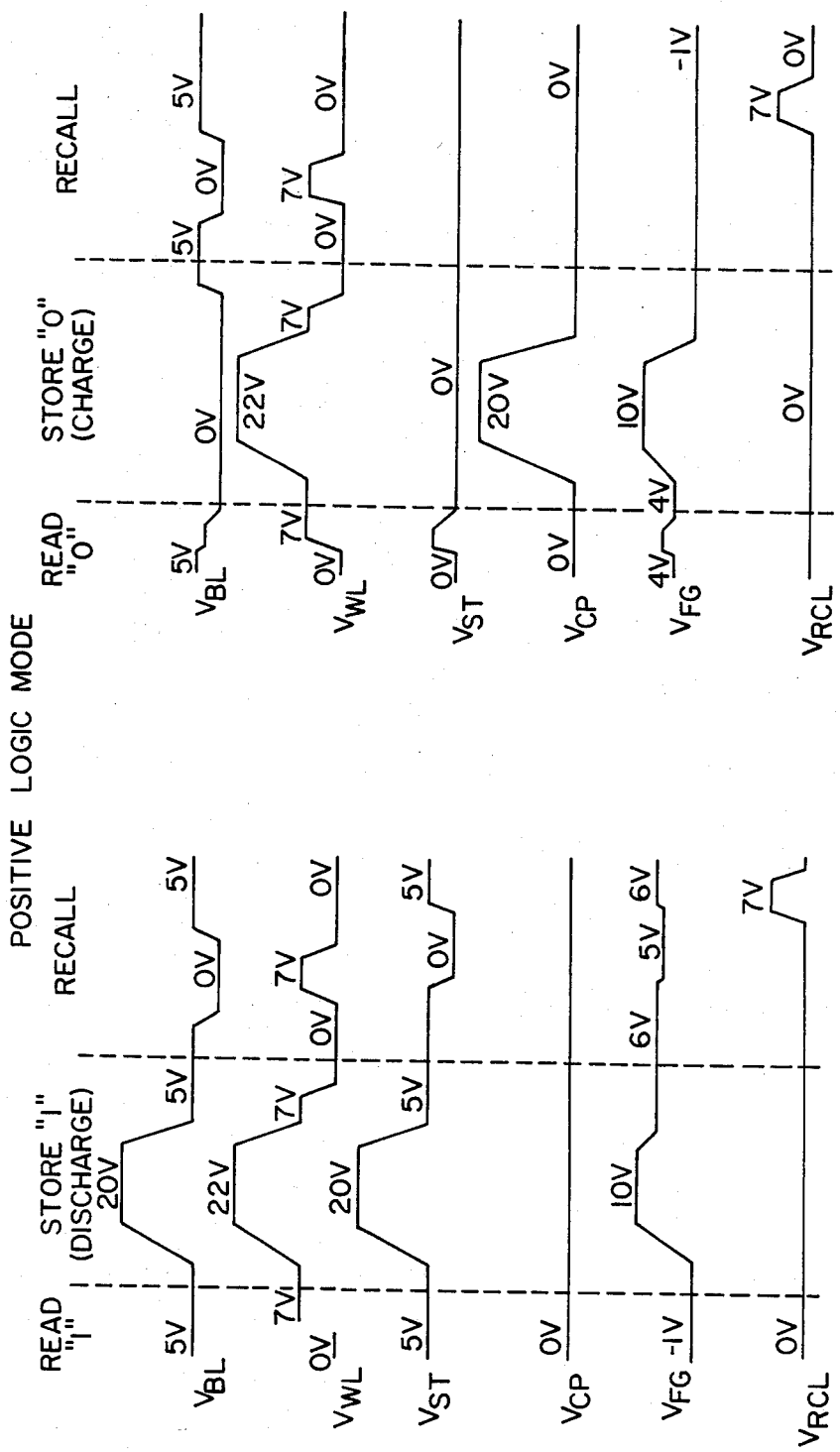

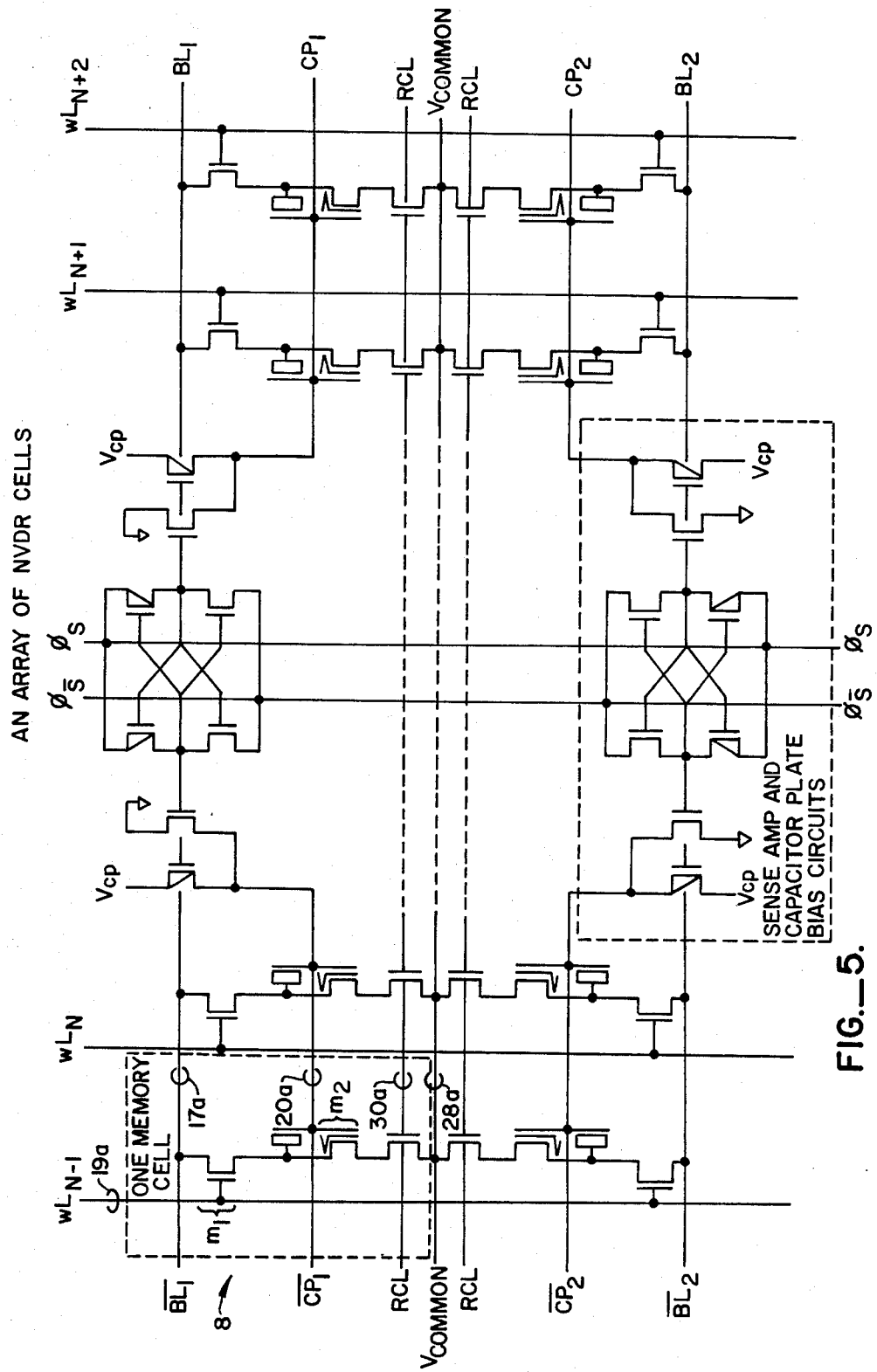
FIG._5.

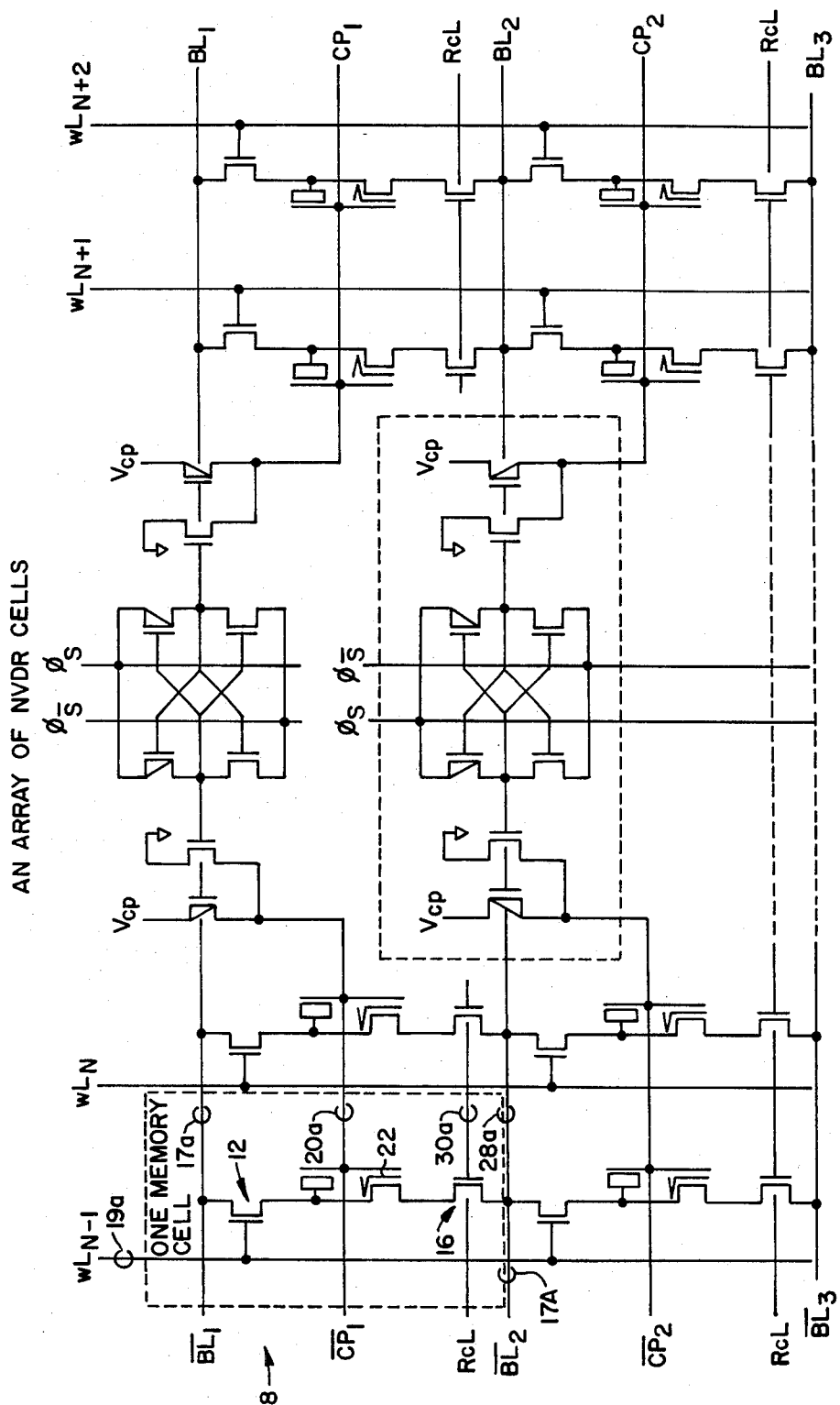
FIG._6.

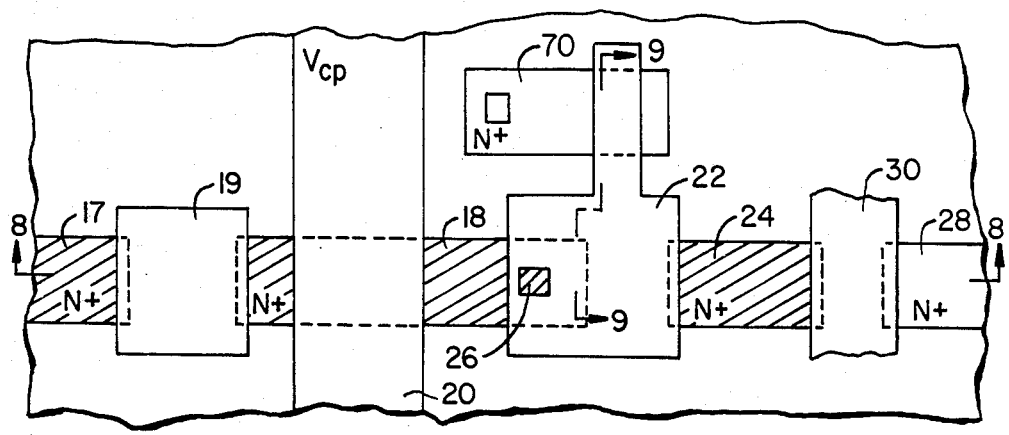
FIG._7.
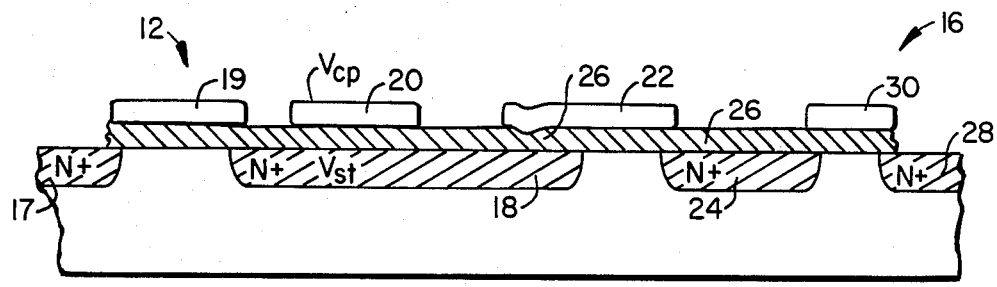
FIG._8.
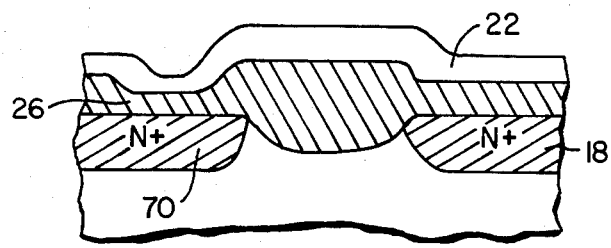
FIG._9.

NON-VOLATILE DYNAMIC RAM CELL

BACKGROUND OF THE INVENTION

1. Field of the Invention

This invention relates to electronic memory circuits, and more particularly, to a non-volatile memory circuit capable both of volatile dynamic RAM storage and non-volatile static ROM storage.

2. Description of the Prior Art

One of the disadvantages of semiconductor RAMs (random access memories) is their volatile nature. These memory devices retain their information only as long as power is supplied to them. However, as soon as power is lost, the stored information is also lost.

Different types of ROMs (read only memories) are used for information which is required to be stored in a non-volatile memory. Recently EPROMs (erasable programmable read only memories) and EEPROMs (electrically erasable programmable read only memories) have become widely available. In an EPROM the user may program the device electrically and erase the entire device by exposing it to ultraviolet light. In an EEPROM the device is programmable and erasable electrically.

While these devices have the desired features of non-volatility, they are somewhat more inconvenient to use than a RAM. The EPROM and EEPROM require higher voltages to program (or WRITE) the device than the operating semiconductor RAMs. Furthermore, high voltages are required to erase information from the EEPROM. The EPROM requires removal of the device from the system for exposure to ultraviolet light. Thus these non-volatile devices do not have the ease by which a RAM can store and change the stored information.

This inconvenience was circumvented by designing a memory cell including a shadow static non-volatile memory portion connected in parallel with a volatile memory portion. A fast WRITE is accomplished by a WRITE into the volatile (dynamic) RAM portion of the memory cell while the non-volatile portion is used for more permanent storage.

A typical shadow static memory cell includes nine transistors and seven access lines, of which six transistors are the standard static memory cell and the additional three transistors and one capacitor are used in the non-volatile portion of the cell. A detailed description of such a memory cell is presented in an article by R. Klein et al. entitled "Five Volt Only, Non-Volatile RAM Owes It All To Polysilicon," *Electronics*, Oct. 11, 1979, pp. 111-116. The large number of circuit elements required to implement a typical shadow static memory cell results in a low density memory circuit.

One way to improve the density of the memory circuit is to replace the static portion of the memory cell by a dynamic memory circuit. In U.S. patent application Ser. No. 558,647 by Rinerson et al. there is disclosed such a cell. This cell includes only two transistors, three capacitors, and three lines. This cell uses a floating gate structure to vary the capacitance of the cell depending on whether the floating gate is charged or discharged. A memory circuit incorporating this cell requires a dummy cell having two capacitors for utilization in sensing either the volatile or the non-volatile data stored in the memory cell.

The presence of the dummy capacitors in that system results in a memory cell having a large area and limits the use of the cell in systems requiring very densely packed small scale memories.

Additionally, existing systems lack the capability of simultaneously transferring information from the non-volatile to the volatile portion of each cell of the memory circuit in a bulk mode RECALL operation. This capability is important, for example, if an unexpected powerdown erases the DRAM and it is desired to transfer a complete start up program from the non-volatile memory.

Accordingly, a great need exists for non-volatile dynamic RAM (NVDRAM) memory circuit that may be scaled for future products and is capable of performing a bulk mode RECALL operation.

SUMMARY OF THE INVENTION

The memory cell of the present invention includes a stacked gate structure that functions as a dynamic storage capacitor in the volatile portion of the cell and also functions as the storage element in the non-volatile portion of the cell. The memory cell stores volatile information by the storage of charge in the dynamic storage capacitor and non-volatile information by the storage of charge on the non-volatile storage element. The quantum of charge stored indicates the value (0 or 1) of the data element stored.

The stacked gate structure includes first and second terminals, a floating gate, a tunnelling structure, and a control gate. The first terminal and control gate are the bottom and top electrodes, respectively, of the dynamic storage capacitor. The floating gate is the non-volatile storage element.

The stacked gate structure also functions as a transistor with the quantum of charge stored on the floating gate determining the conductivity between the first and second terminals of the stacked gate structure. The memory cell includes an access transistor connecting the dynamic storage capacitor to an input/output (I/O) line. The access transistor is responsive to a control signal so that the volatile information may be transferred between the I/O line and the dynamic storage capacitor in a READ or WRITE operation.

The data element stored in the volatile portion of the cell is transferred to the non-volatile portion in a STORE operation. In a STORE operation the state of the data element in the non-volatile portion of the cell is determined by a READ operation. If a 1 is read, then the voltage levels of the control plate and first terminal of the stacked gate structure are adjusted so that electrons tunnel from the floating gate to the first terminal. On the other hand, if a zero is read, then these voltage levels are adjusted so that electrons will tunnel from the first terminal to the floating gate. The quantum of charge stored on the floating gate determines the state of the data element stored on the floating gate.

The memory cell also includes a recall transistor, connected in series with the stacked gate transistor to form a recall circuit, with the recall circuit connecting the dynamic storage capacitor to a common line. The recall transistor is responsive to an RCL control signal so that information may be transferred from the common line through the floating gate transistor to the dynamic storage capacitor.

The data element stored in the non-volatile portion of the memory cell is transferred to the volatile portion in a RECALL operation. In this RECALL operation, the access transistor and I/O line are utilized to initialize the quantum of charge stored in the dynamic storage capacitor to a specified level. The access transistor is then made non-conducting to isolate the dynamic storage capacitor from the I/O line. Next, the recall transistor is made conducting so that the second terminal of the stacked gate transistor is connected to the common line. If the quantum of charge stored on the floating gate causes the stacked gate transistor to be conductive then charge will be transferred between the dynamic storage capacitor and the common line, thereby changing the state of the data elements stored in the storage capacitor from the initialized state. If, on the other hand, the quantum of charge stored on the floating gate causes the stacked gate transistor to be non-conductive then the state of the data element stored in the volatile portion of the memory will be equal to the initialized state. Thus, the state indicated by the quantum of charge stored on the floating gate determines the state stored in the volatile portion of the memory at the end of the RECALL operation. It is apparent that the recall operation is achieved by simply static sensing the quantum of charge on the floating gate.

The RECALL operation may be implemented in a positive or a negative logic mode. In the negative logic mode the storage node is initialized to a positive voltage level. If a 1 is stored on the floating gate then the storage node will discharge through the conducting stacked gate transistor and the resulting 0 voltage level encodes the 1, in negative logic, in the non-volatile portion of the cell. In the positive logic mode, the storage node is initialized to 0 volts. If a 1 is stored on the floating gate then the storage node is charged by the $V_{common}$ line and the resulting positive voltage 1 level encodes the 1, in positive logic, in the non-volatile portion of the cell.

Generally, a higher value of $V_{FG}$ (floating gate voltage) is required to fully charge the storage node than to fully discharge the storage node. Thus, the voltage level on the floating gate, $V_{FG}$, required to program a 1 in the negative logic mode is lower than in the positive logic mode. This reduction of programming voltage is advantageous in many applications.

BRIEF DESCRIPTION OF THE DRAWINGS

FIG. 1 is a cross-sectional view of the memory cell of the present invention.

FIG. 2 is a schematic drawing of the memory cell shown in FIG. 1.

FIGS. 3A and 3B is a graph depicting the voltage levels on the various components of the memory cell during READ, STORE, and RECALL operations of a first operating mode.

FIGS. 4A and 4B is a graph depicting the voltage levels on the various components of the memory cell during READ, STORE, and RECALL operations of a second operating mode.

FIG. 5 is a schematic diagram of a first embodiment of a memory circuit which utilizes the memory cell depicted in FIG. 1.

FIG. 6 is a schematic diagram of a second embodiment of a memory circuit which utilizes the memory cell depicted in FIG. 1.

FIG. 7 is a top view of an embodiment utilizing a single poly floating gate structure.

FIG. 8 is a cross-sectional view of the embodiment depicted in FIG. 7 taken along line 8—8.

FIG. 9 is a cross-sectional view of the embodiment depicted in FIG. 7 taken along line 9—9.

DETAILED DESCRIPTION OF THE PREFERRED EMBODIMENTS

The construction of a memory cell of the present invention is shown in FIG. 1. The memory cell 8 is manufactured in accordance with present day MOS semiconductor technology in a lightly P doped semiconductor substrate 10, typically silicon. The memory cell is formed by an access transistor 12, a stacked gate structure 14, and a recall transistor 16.

The access transistor 12 is formed by first and second heavily doped N+ regions 17 and 18 in the substrate 10. Together with a conducting layer 19, the N+ regions 17 and 18 form an MOS transistor. Conducting layer 19 is the gate of the transistor, while the regions 17 and 18 form first and second terminals respectively, of the access transistor 12. A positive voltage signal on the gate 19 permits the surface region of the substrate 10 below the gate 19 to become conducive so that signals can pass between the regions 17 and 18. The region 17 is also part of an input-output line, commonly called the bit line in semiconductor device terminology.

The stacked gate structure 14 has a conducting layer or conducting plate 20, and a floating gate 22. The stacked gate structure 14 also includes the second heavily doped N+ region 18 and a third heavily doped N+ region 24. Between regions 18 and 24 and above the substrate 10 is the floating gate layer 22 which is electrically isolated from the regions 18 and 24 and the capacitor plate layer 20. The floating gate layer 22 has a double level construction such that the floating gate layer 22 is much closer to the substrate 10 above the region 18 than above other regions of the substrate 10. The region of the lower surface of the floating gate 22 closely disposed over the region 18 is termed the tunneling region of the floating gate 22. A very thin specially fabricated oxide layer, termed a tunneling layer 26, is disposed between the tunneling region of the floating gate and the upper surface of the second N+ region 18. Under appropriate biasing conditions between the floating gate 22 and the second N+ region 18 electrons may tunnel through the tunneling region to charge or discharge the floating gate 22.

The recall transistor 16 is formed by the third N+ region 24 and a fourth N+ region 28 in the substrate 10. Together with a conducting layer 30, the N+ regions 24 and 28 form an MOS transistor. The conducting layer 30 is the gate of the transistor, while the regions 24 and 28 form the first and second terminals of the recall transistor 16. A positive voltage signal on the gate 30 permits the surface region of the substrate 10 below the gate 30 to be conductive so that signals can pass between the third and fourth regions 24 and 28. The fourth region 28 is also part of a common line.

The memory cells are electrically isolated by well known field oxidation techniques, which result in a thick field oxide layer and a field implant layer below. This isolation technique prevents undesired leakage currents from forming between neighboring memory cells. The surface of the substrate 10 is covered by an insulating layer 32 of silicon dioxide. The layer 32 also separates the floating gate 22 from the second N+ region 18. Though the layer is shown as unitary, in actual practice it is formed by a series of insulating layers by semiconductor manufacturing techniques well known to practitioners in the field. The gates 19 and 30 of the access and recall transistors 12 and 16 and the floating gate and control electrode 22 and 20 of the stacked gate structure 14 are formed from doped polycrystalline silicon. In this embodiment the floating gate 22 is deposited and defined before the control gates 19, 20, and 30.

The stacked gate structure 14 performs several distinct functions in the memory cell. The second N+ region 18 and the conducting layer 20 form a dynamic storage capacitor, $C_1$, for storing a quantum of charge indicating the state of the data element in the volatile portion of the memory. The quantum of charge is introduced into the dynamic storage capacitor from the bit line via the access transistor 12 and is stored in the second N+ region 18 which is termed the storage node. The floating gate 22 stores a quantum of charge indicating the state of the data element stored in the non-volatile portion of the memory cell. Finally, the second and third N+ regions 18 and 24 and the floating gate 22 form a stacked gate transistor with the conductivity of the transistor determined by the quantum of charge stored on the floating gate 22.

Schematically, the memory cell 8 appears as shown in FIG. 2. The dynamic storage capacitor, $C_1$, is formed by two electrodes, where the bottom electrode is the second N+ region 18 and the top electrode is the conducting layer 20 of the stacked gate structure 14. The storage capacitor, $C_1$, is coupled to a bit line 17A by the access transistor ($M_1$) 12. When an access signal is present on a word line 19a, which controls the gate 19 of the access transistor 12, the storage capacitor $C_1$ is coupled to the bit line 17a. The conducting plate of the stacked gate structure 20 is connected to a CP control line 20a. A stacked gate transistor, $M_2$, 14 is formed between the second and third isolated regions 18 and 24 with the voltage level, $V_{FG}$, on the floating gate controlling the conductivity of the stacked gate transistor. Finally, a recall transistor, $M_3$, 16 connects the stacked gate transistor $M_2$ to a $V_{common}$ line 28a. When a recall signal is present on line 30a, which controls the gate 30 of the recall transistor, $M_3$, 16, the second terminal of the recall transistor 24 is connected to the $V_{common}$ line 28a.

The volatile portion of the cell has an operating mode like that of a standard dynamic RAM. A dynamic RAM READ operation is performed to obtain volatile information stored in the memory cells. A dynamic RAM WRITE operation transfers information into the memory cells for volatile storage. Finally, a REFRESH operation periodically revitalizes the volatile information stored in the memory cells. These operations are well known in the art and not described herein.

Information is transferred from the volatile portion of the cell to the non-volatile portion of the cell in a STORE operation. A RECALL operation transfers data from the non-volatile portion of the cell to the volatile portion. The designations of the voltage levels of the various components of the memory cell are as follows:

$V_{BL}$ is the voltage level of the bit line 17a; $V_{WL}$ is the voltage level on the word line 19a; $V_{ST}$ is the voltage level of the storage node 18; $V_{CP}$ is the voltage level on the conducting plate 20 of the stacked gate structure 14; $V_{FG}$ is the voltage difference between the floating gate 22 and the storage node 18; and $V_{RCL}$ is the voltage level on the recall line 30a.

The steps necessary to transfer a 1 (high voltage level in positive logic) from the volatile portion of the cell to the non-volatile portion in a STORE operation will now be described with reference to FIG. 2. To read the data element stored in the volatile portion of the cell, $V_{BL}$ is precharged to 5 volts and $V_{WL}$ is pulled to seven volts to turn on the access transistor M1, 12 thereby coupling the bit line 17a to the dynamic storage capacitor $C_1$ for DRAM sensing. The quantity $V_{ST}$ is at five volts since a 1 is stored in the dynamic storage capacitor $C_1$. Accordingly, a 1 is sensed on $V_{BL}$.

This information is transferred to the non-volatile portion of the cell by removing electrons from the floating gate 22 to brin $V_{FG}$ to a high voltage level. This removal of electrons is accomplished by pulling $V_{BL}$ to 20 volts and to $V_{WL}$ 22 volts to pull the storage node to +20 volts while maintaining the voltage level, $V_{CP}$, of the conducting plate 20 at 0 volts. The voltage drop between the storage node 18 and the conducting plate 20 is capacitively coupled to the floating gate 22 to cause a voltage drop sufficient to cause electrons to tunnel from the floating gate 22 to the storage node 18. Thus, the quantum of charge stored on the floating gate encodes a 1, in positive logic, in the non-volatile portion of the memory. Since the floating gate 22 is electrically isolated from the remainder of the memory cell this information is permanently encoded until a subsequent STORE operation reprograms the floating gate 22.

The 1 stored on the floating gate may be transferred back to the dynamic volatile portion of the memory by a RECALL operation.

The RECALL operation may be implemented in either a positive logic or a negative logic mode. The negative logic mode has advantages that will become apparent in the following discussion and is described first in FIG. 3A.

The term negative logic is used herein to describe a system where a low voltage level represents a 1. Thus, an embodiment utilizing a negative logic RECALL operation includes overhead to integrate the negative logic RECALL operation into the overall positive logic of the cell. Systems for performing this operation are known in the art.

As set forth above, a 1 is stored on the floating gate 22 by causing electrons to tunnel from the floating gate 22 to the storage node 18. Thus, a positive (high) voltage on the floating gate encodes a 1. The storage node 18 is initialized to plus five volts by setting $V_{BL}$ equal to five volts and coupling the storage node 18 to the bit line by briefly turning on the access transistor 12. The access transistor 12 is then turned off so that the storage node 18 is isolated from the bit line 17a. Subsequently, the recall transistor 16 is turned on to connect the second terminal 24 of the stacked gate transistor $M_2$ to the V common line which is grounded at zero volts. The value of $V_{FG}$ is selected to make $M_2$ conductive, thereby allowing the charge stored in the storage node to leak through the stacked gate transistor $M_2$ and the recall transistor, $M_3$, 16 to the common line 28a. The stacked gate transistor, $M_2$, is designed so that a value of $V_{FG}$ equal to approximately 2 volts causes the stacked gate transistor, $M_2$, to be sufficiently conductive to allow the charge stored on the storage node 18 to leak from the dynamic storage capacitor $C_1$ and bring the voltage level on the dynamic storage capacitor down to zero volts. The recall transistor 16 is then turned off to isolate the storage node, resulting in a quantum of charge causing the storage node voltage level, $V_{ST}$, to be equal to zero. Thus, the data element 1 (low voltage in negative logic) has been transferred from the non-volatile to the volatile portion of the memory.

A positive logic RECALL "1" operation is implemented as follows. Referring to FIG. 4A, the storage node is initialized to 0 volts by setting $V_{BL}$ equal to 0 volts and coupling the storage node 18 to the bit line by briefly turning on the access transistor 12. The access transistor 12 is then turned off so that the storage node is isolated from the bit line 17a. Subsequently, the recall transistor 16 is turned on to connect the second terminal 24 of the stacked gate transistor $M_2$ to the $V_{common}$ line which is at 5 volts. The value of $V_{ST}$ must be pulled to +5 volts to encode a 1 in positive logic. Therefore, the value of $V_{FG}$ must be selected so that the stacked gate transistor is sufficiently conductive to allow $V_{ST}$ to be pulled to the full +5 volts on the $V_{common}$ line 28a. When the storage node is pulled to 5 volts, the recall transistor 16 is turned off to isolate the storage node, resulting in a voltage level of 5 volts on the dynamic storage capacitor, thereby indicating that a +1 is stored in the volatile portion of the memory. Thus, the data element stored in the non-volatile portion of the memory has been transferred to the volatile portion of the memory.

The embodiment described in the negative logic mode requires that $V_{FG}$ be programmed to plus two volts to make M2 conductive to discharge $V_{ST}$. The embodiment described in the positive logic mode requires that $V_{FG}$ be programmed to plus five volts to make M2 conductive enough to pass five volts into $V_{ST}$. This three volts reduction in $V_{FG}$ results in lowering the programming voltage or programming duration in the store operation. The requirement of including overhead to integrate the negative logic RECALL operation into the overall positive logic of the cell is outweighed by the advantages of lower $V_{FG}$ requirement as described above.

The steps necessary to transfer a zero (low voltage level in positive logic) from the volatile portion of the cell to the non-volatile portion in the STORE operation will now be described with reference to FIGS. 3B and 4B.

To read the data element stored in the volatile portion of the cell, $V_{BL}$ is precharged to five volts and $V_{WL}$ is pulled to seven volts to turn on the access transistor, $M_1$, 12 thereby coupling the bit line 17a to the dynamic storage capacitor, $C_1$ for DRAM sensing. The quantity $V_{ST}$ is at zero volts since a 0 is stored in the dynamic storage capacitor $C_1$. Accordingly, a 0 will be sensed on $V_{BL}$.

This information is transferred to the non-volatile portion of the cell by transferring electrons to the floating gate 22 to bring $V_{FG}$ to a low voltage level. This addition of electrons is accomplished by keeping $V_{BL}$ at ground and selectively pulling $V_{WL}$ and $V_{CP}$ to about plus twenty volts. The voltage increase between the storage node 18 and the conducting plate 20 is capacitively coupled to the floating gate 22 to cause a voltage increase sufficient to cause electrons to tunnel to the floating gate 22 from the storage node 18. Thus, the quantum of charge stored on the floating gate encodes a 1, in positive logic, in the non-volatile portion of the memory. Since the floating gate is electrically isolated from the remainder of the memory cell this information is permanently encoded until a subsequent STORE operation reprograms the floating gate 22.

The 0 stored on the floating gate may be transferred back to the dynamic non-volatile portion of the memory by a RECALL operation. As described above for a 0 RECALL operation, the RECALL operations may be implemented either in a negative logic or a positive logic mode as described above. Referring to FIG. 3B, in the negative logic mode the storage node is initialized to plus five volts by setting $V_{BL}$ equal to plus five volts and coupling the storage node 18 to the bit line by briefly turning on the access transistor 12. Since the floating gate 22 has a low voltage level $V_{FG}$ the stacked gate transistor $M_2$ is non-conductive and the initial five volts remains on $C_1$ when the recall transistor $M_3$ is turned on. Thus, a plus five volt level on $C_1$ indicates the 0 stored on the floating gate in a negative logic mode.

In the positive logic mode in FIG. 4B, the storage node is initialized to 0 volts by setting $V_{BL}$ equal to zero volts and coupling the storage node 18 to the bit line 17A by briefly turning on the access transistor 12. The stacked gate transistor $M_2$ is non-conductive because the voltage level $V_{FG}$ is low. Thus, when the recall transistor 16 is turned on the dynamic storage capacitor is isolated from the common line 28a by the stacked gate transistor and the voltage level $V_{ST}$ on the storage node 18 remains at zero volts. Thus, the 0 stored on the floating gate 22 is transferred to the dynamic storage capacitor $C_1$.

FIG. 5 illustrates a memory circuit which utilizes the novel memory cell. The memory circuit is part of a non-volatile dynamic RAM which operates as an ordinary dynamic RAM in one mode and as a non-volatile memory storage device in another mode. For purposes of understanding the invention, the same reference numerals are used in the drawings wherever possible. The circuit depicted in FIG. 5 depicts a rectangular array of memory cells arranged in rows and columns where a column of memory cells is connected to a selected bit line 17a and where a given row of the memory array is enabled by a signal on a word line 19a. The circuit also includes control lines, CP 20a and RCL 30a, for controlling the voltage levels on the control gates of the stacked gate structure 14 and recall transistor, respectively. A $V_{common}$ line 28a is disposed between consecutive bit lines, for example $\overline{BL}_1$ and $\overline{BL}_2$.

A bulk mode RECALL operation is possible utilizing the memory circuit depicted in FIG. 5. In a bulk mode RECALL operation data is simultaneously transferred from the non-volatile to the volatile portion of every memory cell in the circuit. This bulk mode RECALL operation is possible because storage node initialization is done through $M_1$ and the bit line 17a while non-volatile data recall is done through $M_3$ and the common line 28a. These initialization and recall operations never happen simultaneously, so that, the data transferred through the stacked gate transistor $M_2$ to the dynamic storage capacitor $C_1$ for each cell is independent of adjacent cells. This bulk mode recall operation substantially decreases the time required to transfer non-volatile data to the volatile portions of the memory cells in the circuit, thereby increasing speed of the memory.

The memory circuit depicted in FIG. 5 may also be modified so that the memory functions as an EEPROM (electrically erasable programmable read only memory). To function in this mode, the voltage on the recall line, $V_{CL}$, is set equal to $V_{CC}$ and the voltage on the common line $V_{common}$ is set equal to ground. Thus, the same memory circuit may be utilized as a non-volatile dynamic RAM or as an EEPROM, thereby providing a memory circuit of high versatility.

In FIG. 6 an alternate embodiment of the memory circuit is depicted where the bit line of one column of cells, e.g. $\overline{BL}_2$, functions as the common line of a second column of cells. This dual function of $\overline{BL}_2$ is possible because the access transistor $M_1$ and the recall transistor $M_3$ do not turn on at the same time. For example, during a dynamic READ or WRITE operation the memory cell positioned in the grid defined by $WL_{n-1}$ and $\overline{BL_1}$ is isolated from $\overline{BL_2}$ by the recall transistor 16. Similarly, when the floating gate 22 is being programmed the memory cell is isolated from $\overline{BL_2}$. However, when $\overline{BL_2}$ is being utilized to sense the charge on the floating gate during a RECALL operation, the $\overline{BL_1}$ line is isolated by the access transistor 12. Thus, $\overline{BL_1}$ and $\overline{BL_2}$ are never connected to the cell at the same time.

An alternative embodiment of the invention utilizing a single poly floating gate structure is depicted in FIGS. 7 through 9. The structure and operation of the single poly structure are fully described in the copending, commonly assigned U.S. patent application Ser. No. 587,086 by Maltiel. Briefly, the coupling electrode for applying programming voltage to the floating gate is disposed below the floating gate and comprises a heavily-doped, isolated region formed along the surface of the semiconductor substrate.

Referring now to FIG. 7, a top view of a memory cell utilizing the single poly structure and incorporating the principles of the present invention is depicted. Note that the conducting plate 20 does not extend over the floating gate 22. Instead, a coupling electrode 70 functions to provide programming voltage to the floating gate 22. Both the conducting plate 20 and the coupling electrode 70 are tied to $V_{CP}$ with the voltage supplied by line CP, 20a of FIG. 2.

FIGS. 8 and 9 are cross-sectional views of the embodiment of FIG. 7 taken along lines 8—8 and 9—9, respectively.

The foregoing is a detailed description of preferred embodiments of the invention. It is understood by persons of ordinary skill in the art that alternative processes of circuits and materials may be substituted for many of the processes, circuits, and materials described above to perform substantially the same functions in the same manner. For example, the conductivity states of the substrate and buried region may be reversed. Additionally, the geometric layout of the control lines in the memory circuit may be altered. Accordingly, the full scope of the present invention is defined by the appended claims.

What is claimed is:

1. A memory cell interconnecting an input/output bit line and a common line, comprising:
    an access transistor having a first terminal coupled to said input/output bit line, a second terminal, and having an access control gate for coupling said first terminal to said second terminal responsive to access control signals;
    a stacked gate transistor, having a floating gate, a conducting plate, first and second terminals, and a tunneling structure positioned between said first terminal and said floating gate where said second terminal of said access transistor is coupled to said first terminal of said stacked gate transistor, said floating gate and conducting plate being positioned spaced from another and from said first and second terminals, and a dielectric medium extending throughout the region of space between said floating gate, conducting plate, and said first and second terminals;
    a portion of said conducting plate being positioned facing and spaced from said first terminal and forming with said first terminal and said dielectric medium a storage capacitor; and,
    a recall transistor having a first terminal coupled to the second terminal of said stacked gate transistor, a second terminal coupled to said common line, and having a recall control gate for coupling said first terminal to said second terminal responsive to recall control signals.

2. The invention of claim 1 wherein said terminals of said access, stacked gate, and recall transistors are isolated N+ regions formed along the surface of a P− monocrystalline silicon substrate.

3. The invention of claim 2 wherein said second terminal of said access transistor and said first terminal of said stacked gate transistor are each formed by a first isolated N+ region termed a "storage node".

4. The invention of claim 3 wherein said second terminal of said stacked gate transistor and said first terminal of said recall transistor are each formed by a second isolated N+ region.

5. The invention of claim 4 wherein said floating gate is an electrically isolated polysilicon layer disposed above the surface of said substrate, said floating gate having a region of its lower surface, termed a "tunneling region," disposed over said storage node.

6. The invention of claim 5 wherein said tunneling structure comprises:
    a tunneling oxide layer disposed between said tunneling region and the upper surface of said storage node.

7. The invention of claim 6 further including:
    means to selectively impose on said input/output bit line a potential of substantially +5 or +20 volts.

8. The invention of claim 7 further comprising:
    means to selectively impose on said access control gate a potential of substantially +7 or +20 volts.

9. The invention of claim 8 further comprising:
    means to selectively impose on said conducting plate of said stacked gate transistor a potential of substantially +20 volts.

10. The invention of claim 1 wherein a plurality of said memory cells are interconnected to form a memory circuit, with a first column of memory cells being the memory cells connected to a first I/O bit line.

11. The invention of claim 10 further including:
    a first word line disposed substantially perpendicular to said first I/O bit line, interconnected with access control gates of a first row of memory cells;
    a first recall line, disposed substantially parallel to said first I/O bit line, interconnected with the recall control gates of the memory cells in said first column; and
    a first common line, disposed substantially parallel to said first I/O bit line, interconnected to the second terminal of the recall transistors of the memory cells in said first column.

12. The invention of claim 11 wherein the voltage level on said first recall line, $V_{RCL}$, is set equal to $V_{CC}$ and where said common line is grounded thereby allowing said memory circuit to be operated as an $E^2PROM$.

13. The invention of claim 11 wherein said common line is a second bit line interconnecting a second column of memory cells whereby said first and second column of memory cells may be electrically isolated since the recall transistors in said first column and said access transistors in said second column are not turned on at the same time.

14. A memory cell comprising:
    a stacked gate transistor having first and second terminals, a floating gate, a tunneling structure, and a conducting plate, said floating gate and conducting plate being positioned spaced from one another and from said first and second terminals, and a dielectric medium extending throughout the region of space between said floating gate, conducting plate, and said first and second terminals;

a portion of said conducting plate being positioned facing and spaced from said first terminal with a portion of said dielectric medium therebetween, said plate portion and said first terminal forming, together with said dielectric portion, a dynamic storage capacitor, with the conducting plate being the top electrode of said storage capacitor and with the first terminal being the bottom electrode of said storage capacitor;

an I/O bit line, and an access transistor interconnecting said I/O bit line and said dynamic storage capacitor;

a recall transistor connecting the second electrode of said stacked gate transistor to a common line;

whereby a non-volatile data element may be stored by controlling the charge stored on said floating gate and said non-volatile data element may be sensed to recall the non-volatile data from the floating gate to the dynamic storage capacitor.

15. A non-volatile dynamic random access memory (NVDRAM) cell of the type including a non-volatile memory element having a floating gate for storing a quantum of charge indicating a non-volatile data state and having a shadow dynamic RAM (DRAM) element having a dynamic storage capacitor for storing a quantum of charge indicating a volatile data state, said cell comprising:

means for reading and writing data into the DRAM element;

means for transferring data from the DRAM element to the non-volatile memory element in a store operation; and means for static sensing the non-volatile data state in said non-volatile memory element to transfer data from said non-volatile memory element to said DRAM element in a recall operation.

16. The invention of claim 15 wherein the floating gate and the dynamic storage capacitor are formed by a stacked gate transistor structure.

17. The invention of claim 16 wherein said stacked gate transistor structure comprises:

first and second terminals and a conducting plate, with said first terminal and said conducting plate forming said dynamic storage capacitor; and a tunneling structure for charging and discharging said floating gate.

18. The invention of claim 17 wherein said means for reading and writing data into said DRAM element comprises:

an I/O line;

an access transistor connecting said I/O line to said dynamic storage capacitor; and means for controlling the conductivity of said access transistor.

19. The invention of claim 18 wherein said means for transferring data from said DRAM to said non-volatile memory element comprises:

means for tunneling electrons between said floating gate and said first terminal to adjust the quantum of charge stored on said floating gate to correspond to the data state in said DRAM.

20. The invention of claim 19 wherein said means for static sensing comprises:

means for initializing the quantum of charge stored in said dynamic storage capacitor;

a common line;

a recall transistor connecting said second terminal of said stacked gate transistor structure to said common line; and means for controlling the conductivity of said recall transistor whereby the quantum of charge stored on said floating gate determines the amount of charge transfer between said initialized dynamic storage capacitor and said common line, thereby determining the state of the data element stored in said non-volatile memory element.

21. A method for transferring a data element from the non-volatile to the volatile portion of a NVDRAM cell of the type including a stacked gate structure having first and second terminals, a floating gate, and a conducting plate with the state of the data element in said volatile portion determined by the voltage level, $V_{ST}$, on the first terminal of the stacked gate structure and with the state of the data element in said non-volatile portion determined by the voltage level, $V_{FG}$, on the floating gate, conductivity between said first and second terminals being directly related to and controlled by $V_{FG}$, said method comprising the steps of:

initializing the voltage level on said first terminal, $V_{ST}$, to a first value;

pulling the voltage level on said second terminal to a second value; and assigning voltage levels of said floating gate, $V_{FG}$, to indicate a selected binary value (0 or 1) of said data element in said non-volatile portion so that the resulting voltage level on the first terminal indicates the state of the data element in said non-volatile portion.

22. The method of claim 21 further comprising the steps of:

selecting said first voltage value to be equal to about +5 volts; and selecting the value of $V_{FG}$ to equal about two volts to indicate a binary value of 1 and to equal about zero volts to equal a binary value of zero.

23. The method of claim 21 further comprising the steps of:

selecting said first voltage value equal to about zero volts; and selecting the value of $V_{FG}$ to be about 5 volts to indicate a binary value of 1 and to be about 0 volts to indicate a binary value of zero.

24. The method of claim 22 or 23 wherein said step of initializing the voltage level on said first terminal, $V_{ST}$, comprises the steps of:

providing an I/O bit line and an access transistor, with said access transistor having an access control gate receiving an access control signal that controls the conductivity of said access transistor;

connecting said I/O bit line to said first terminal with said access transistor;

providing an access control signal to make said access transistor conductive; and pulling the voltage level of said I/O bit line, $V_{BL}$, to said first value.

25. The method of claim 24 wherein said step of pulling said second terminal to said second voltage value comprises the steps of:

providing a common line and a recall transistor, with the recall transistor having a recall control gate for receiving recall control signals for controlling the conductivity of said recall transistor;

connecting said common line to said second terminal with said recall transistor;

providing a recall control signal to make said recall transistor conductive; and pulling the voltage level on said recall line, $V_{RCL}$, to said second value.

26. A method for transferring a data element from the volatile portion to the non-volatile portion of a NVDRAM cell of the type including a stacked gate structure having first and second terminals, a floating gate, and a control gate, with the state of the data element in the volatile portion being determined by the voltage level, $V_{ST}$, on the first terminal of the stacked gate structure and with the state of the data element in the non-volatile portion being determined by the voltage level, $V_{FG}$, on the floating state, said method comprising the steps of:

reading the state of the volatile element by a dynamic RAM READ operation; and programming the voltage level on the floating gate to indicate the state of the volatile data element determined by the dynamic READ operation.

27. A memory cell interconnecting an I/O bit line and a common line, comprising:

an access transistor having a first terminal coupled to the I/O bit line, a second terminal, and having an access control gate for coupling said first terminal to said second terminal responsive to access control signals;

a single poly floating gate structure, having a floating gate, a coupling electrode disposed below said floating gate, first and second terminals, and a tunneling structure for charging and discharging said floating gate where said second terminal of said access transistor is coupled to said first terminal of said stacked gate transistor;

a storage capacitor having a top electrode and a bottom electrode being said first terminal of said single poly floating gate structure; and a recall transistor having a first terminal coupled to the second terminal of said single poly floating gate structure, a second terminal coupled to common line, and having a recall control gate for coupling said first terminal to said second terminal responsive to recall control signals.

28. The invention of claim 27 wherein said terminals of said access transistor, said single poly structure, and said recall transistors are isolated N+ regions formed along the surface of a P− monocrystalline silicon substrate.

29. The invention of claim 28 wherein said second terminal of said access transistor and said first terminal of said single poly structure are formed by a first isolated N+ region termed a "storage node."

30. The invention of claim 29 wherein said second terminal of said single poly structure and said first terminal of said recall transistor are formed by a second isolated N+ region.

31. The invention of claim 30 wherein said floating gate is an isolated polysilicon layer disposed above the surface of said substrate, said floating gate having a region of its lower surface, termed a "tunneling region," disposed over said storage node.

32. The invention of claim 31 wherein said tunneling structure comprises:

a tunneling oxide layer disposed between said tunneling region and the upper surface of said storage node.

33. The invention of claim 32 further including:

means for pulling said I/O bit line to about +5 volts or +20 volts.

34. The invention of claim 33 further comprising:

means for pulling the voltage of said access control gate to about +7 volts or +20 volts.

35. The invention of claim 34 further comprising:

means for pulling the coupling electrode of said single poly structure to about +20 volts.

36. The invention of claim 27 wherein a plurality of said memory cells are interconnected to form a memory circuit, with a first column of memory cells being the memory cells connected to a first I/O bit line.

37. The invention of claim 36 further including:

a first word line disposed substantially perpendicular to said first I/O bit line, interconnected with access control gates of a first row of memory cells;

a first recall line, disposed substantially parallel to said first I/O bit line, interconnected with the recall control gates of the memory cells in said first column; and a first common line, disposed substantially parallel to said first I/O bit line, interconnected to the second terminal of the recall transistors of the memory cells in said first column.

38. The invention of claim 37 wherein the voltage level on said first recall line, $V_{RCL}$, is set equal to $V_{CC}$ and where said common line is grounded thereby allowing said memory circuit to be operated as an $E^2PROM$.

39. The invention of claim 37 wherein said common line is a second bit line interconnecting a second column of memory cells whereby said first and second column of memory cells may be electrically isolated since the recall transistors in said first column and said access transistors in said second column are not turned on at the same time.

40. A memory cell comprising:

an access transistor;

a dynamic storage capacitor, having a top and a bottom electrode, with said storage capacitor being connected to an I/O line by said access transistor;

a single poly floating gate structure having first and second terminals, a floating gate, a tunneling structure, and a coupling electrode disposed below said floating gate, with the first terminal being the bottom electrode of said storage capacitor;

a recall transistor connecting the second electrode of said single poly structure to a common line;

whereby a non-volatile data element may be stored by controlling the charge stored on said floating gate and said non-volatile data element may be sensed to recall the non-volatile data from the floating gate to the dynamic storage capacitor.

* * * * *